US011908901B1

United States Patent
Koester et al.

(10) Patent No.: US 11,908,901 B1
(45) Date of Patent: Feb. 20, 2024

(54) GRAPHENE VARACTOR INCLUDING FERROELECTRIC MATERIAL

(71) Applicant: Regents of the University of Minnesota, Minneapolis, MN (US)

(72) Inventors: Steven J. Koester, Edina, MN (US); Venkata Raghava Saran Kumar Chaganti, Minneaplis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 16/818,494

(22) Filed: Mar. 13, 2020

Related U.S. Application Data

(60) Provisional application No. 62/818,498, filed on Mar. 14, 2019.

(51) Int. Cl.
*H01L 29/16* (2006.01)
*H01L 29/40* (2006.01)
*H01L 21/28* (2006.01)
*H01L 29/93* (2006.01)

(52) U.S. Cl.
CPC ........ *H01L 29/1606* (2013.01); *H01L 29/408* (2013.01); *H01L 29/40111* (2019.08); *H01L 29/93* (2013.01)

(58) Field of Classification Search
CPC ........... H01L 29/1606; H01L 29/40111; H01L 29/408; H01L 29/93
USPC ....................................................... 257/295
See application file for complete search history.

(56) References Cited

U.S. PATENT DOCUMENTS

| | | | |
|---|---|---|---|
| 8,557,686 B1 * | 10/2013 | Zhu | G11C 13/0014 977/734 |
| 9,513,244 B2 | 12/2016 | Koester | |
| 9,865,712 B2 * | 1/2018 | Okamoto | H01L 21/385 |
| 10,191,005 B2 | 1/2019 | Koester | |
| 10,712,302 B2 | 7/2020 | Koester | |
| 2005/0212014 A1 | 9/2005 | Horibe | |
| 2007/0093008 A1 | 4/2007 | Choi | |
| 2008/0315277 A1 * | 12/2008 | Nakashiba | H01L 29/94 257/E29.345 |
| 2009/0225592 A1 * | 9/2009 | Lau | H01L 29/78684 365/170 |
| 2010/0025660 A1 | 2/2010 | Jain et al. | |
| 2010/0109712 A1 * | 5/2010 | Zaliznyak | H01F 10/3218 257/29 |
| 2010/0258787 A1 * | 10/2010 | Chae | H01L 29/78684 257/39 |
| 2011/0006837 A1 * | 1/2011 | Wang | H01L 29/778 327/539 |

(Continued)

FOREIGN PATENT DOCUMENTS

| | | |
|---|---|---|
| WO | 2010075012 A3 | 7/2010 |
| WO | 20100075012 A3 | 7/2010 |
| WO | 2011023603 A3 | 3/2011 |

OTHER PUBLICATIONS

Appenzeller et al., "Toward Nanowire Electronics," IEEE Transactions on Electron Devices, vol. 55, No. 11, Nov. 2008, 21 pp.

(Continued)

*Primary Examiner* — Sheikh Maruf
(74) *Attorney, Agent, or Firm* — Shumaker & Sieffert, P.A.

(57) ABSTRACT

A varactor may include a gate electrode; a graphene layer; and a ferroelectric layer between the gate electrode and the graphene layer.

20 Claims, 9 Drawing Sheets

(56) References Cited

U.S. PATENT DOCUMENTS

| | | | | |
|---|---|---|---|---|
| 2011/0089404 | A1* | 4/2011 | Marcus | B82Y 40/00 |
| | | | | 257/29 |
| 2011/0101309 | A1* | 5/2011 | Lin | H01L 29/1606 |
| | | | | 257/29 |
| 2011/0103138 | A1* | 5/2011 | Wunderlich | H01L 29/26 |
| | | | | 365/158 |
| 2011/0149670 | A1* | 6/2011 | Heo | G11C 11/161 |
| | | | | 428/688 |
| 2011/0260293 | A1* | 10/2011 | Narita | H01G 4/33 |
| | | | | 257/595 |
| 2012/0146743 | A1* | 6/2012 | Ermolov | H01L 28/60 |
| | | | | 977/734 |
| 2012/0161731 | A1 | 6/2012 | Voutilainen | |
| 2012/0280336 | A1* | 11/2012 | Jan | G11C 11/161 |
| | | | | 257/E29.323 |
| 2013/0170290 | A1* | 7/2013 | Odagawa | H01L 43/08 |
| | | | | 365/158 |
| 2013/0214242 | A1* | 8/2013 | Sandhu | H01L 29/7788 |
| | | | | 977/734 |
| 2013/0330885 | A1* | 12/2013 | Chen | H01L 29/42384 |
| | | | | 977/734 |
| 2014/0014905 | A1* | 1/2014 | Lee | H01L 29/78684 |
| | | | | 977/734 |
| 2014/0145735 | A1* | 5/2014 | Koester | H01L 29/1606 |
| | | | | 324/686 |
| 2014/0170779 | A1* | 6/2014 | Kelber | H01L 29/78603 |
| | | | | 438/3 |
| 2014/0212671 | A1* | 7/2014 | Kelber | H01L 43/10 |
| | | | | 428/408 |
| 2019/0051816 | A1* | 2/2019 | Shiokawa | G11C 11/161 |
| 2019/0148406 | A1* | 5/2019 | Liu | H01L 29/6684 |
| | | | | 257/295 |
| 2020/0091274 | A1* | 3/2020 | Sharma | H01L 29/66757 |
| 2020/0091306 | A1* | 3/2020 | Heo | H01L 29/7869 |
| 2020/0203379 | A1* | 6/2020 | Kalitsov | H01L 29/516 |
| 2020/0203380 | A1* | 6/2020 | Prasad | H01L 29/40111 |
| 2020/0212224 | A1* | 7/2020 | Penumatcha | G11C 11/2275 |

OTHER PUBLICATIONS

Bolotin et al., Ultrahigh electron mobility in suspended graphene, Solid State Communications, vol. 146, ScienceDirect, Mar. 6, 2008, 5 pp.
Chen et al., "Intrinsic and extrinsic performance limits of graphene devices on SiO2," Nature Nanotechnology, vol. 3, Apr. 2008, 4 pp.
Chen et al., "Mobility Extraction and Quantum Capacitance Impact in High Performance Graphene Field-effect Transistor Devices," 2008 International Electron Devices Meeting, Technical Digest, Dec. 15-17, 2008, 5 pp.
Dorgan et al., "Mobility and saturation velocity in graphene on SiO2," Applied Physics Letters, vol. 97, No. 8, Aug. 23, 2010, 4 pp.
Dragoman et al., "Graphene-Based Quantum Electronics", Progress in Quantum Electronics 33 (2009), pp. 165-214. Applicant points out, in accordance with MPEP 609.04(a), that the year of publication, 2016, is sufficiently earlier than the effective U.S. filing date, so that the particular month of publication is not in issue.
Droscher et al. "Quantum capacitance and density of states of graphene", arXiv: 1 001.4690v1 [cond-mal.mes-hall], JARA-FIT and II. Institute of Physics Jan. 26, 2010, 3 pgs.
Fallahazard et al., Dielectric thickness dependence of carrier mobility in graphene with HfO2 top dielectric, Applied Physics Letters, vol. 97, No. 12, Sep. 20, 2010, 4 pp.
Fang et al., "Carrier statistics and quantum capacitance of graphene sheets and ribbons," Applied Physics Letters, 91, No. 9, Aug. 27, 2007, 4 pp.
Farmer et al., "Utilization of a Buffered Dielectric to Achieve High Field-Effect Carrier Mobility in Graphene Transistors," Nano Letters, vol. 9, No. 12, Oct. 19, 2009, 5 pp.
Franklin et al., "Channel and Contact Length Scaling in Carbon Nanotube Transistors," 68th Device Research Conference, Jun. 21-23, 2010, 4 pp.

Han et al., "Energy Band-Gap Engineering of Graphene Nanoribbons," Physical Review Letters, vol. 98, May 16, 2007, 4 pp.
Huang et al., "Nanoelectronic biosensors based on CVD grown graphene, " Nanoscale, vol. 2, Apr. 13, 2010, 4 pp.
Kang et al., "An Improved Pregate Cleaning Process for High-k Gate Dielectric Fabrication," Electrochemical and Solid State Letters, vol. 8, No. 11, Sep. 16, 2005, 4 pp.
Kang et al., "Ultrathin HfO2(EOT<0.75 nm) Gate Stack with TaN/HfN Electrodes Fabricated Using a High-Temperature Process," Electrochemical and Solid-State Letters, vol. 8, No. 11, Sep. 12, 2005, 3 pp.
Kim et al., "Realization of a high mobility dual-gated graphene field-effect transistor with Al2O3 dielectric," Applied Physics Letters, vol. 94, No. 6, Feb. 9, 2009, 4 pp.
Knoch et al., "Outperforming the Conventional Scaling Rules in the Quantum-Capacitance Limit," IEEE Electron Device Letters, vol. 29, No. 4, Apr. 2008, 5 pp.
Konar et al., "Effect of high-k gate dielectrics on charge transport in graphene-based field effect transistors," Physical Review B, vol. 82, Sep. 29, 2010, 7 pp.
Lee et al., "RF Performance of Pre-patterned Locally-embedded-Back-Gate Graphene Device," 2010 International Electron Devices Meeting, Technical Digest, Dec. 6-8, 2010, 5 pp.
Li et al., "Large-Area Synthesis of High-Quality and Uniform Graphene Films on Copper Foils," Science, vol. 324, No. 5932, Jun. 5, 2009, 4 pp.
Liang et al., "Performance Projections for Ballistic Graphene Nanoribbon Field-Effect Transistors," IEEE Transactions on Electron Devices, vol. 54, No. 4, Apr. 2007, 8 pp.
Lin et al., "100-GHz Transistors from Wafer-Scale Epitaxial Graphene," Science, vol. 327, No. 5966, Feb. 5, 2010, 2 pp.
Luryi, "Quantum capacitance devices," Applied Physics Letters, vol. 52, No. 6, Feb. 8, 1988, 4 pp.
McCreery et al., "Control of reactivity at carbon electrode surfaces," Colloids and Surfaces A: Physicochemical and Engineering Aspects, vol. 93, Mar. 15, 1994, 10 pp.
Nagashio et al., "Contact resistivity and current flow path at metal/graphene contact," Applied Physics Letters, vol. 97, No. 14, Oct. 4, 2010, 4 pp.
Neto et al., "The electronic properties of graphene," Reviews of Modern Physics, vol. 81, No. 1, Jan. 14, 2009, 55 pp.
Nopper et al., "Wireless Readout of Passive LC Sensors," IEEE Transactions on Instrumentation and Measurement, vol. 59, No. 9, Sep. 2010, 11 pp.
Novoselov et al., "Two-dimensional gas of massless Dirac fermions in graphene," Nature, vol. 438, No. 7064, Nov. 10, 2005, 6 pp.
Ohta et al., "Controlling the Electronic Structure of Bilayer Graphene," Science, vol. 313, No. 5789, Aug. 18, 2006, 6 pp.
Peres et al., "Electronic properties of disordered two-dimensional carbon," Physical Review B, vol. 73, Mar. 16, 2006, 23 pp.
Pinto et al., "P-type doping of graphene with F4-TCNQ," Journal of Physics: Condensed Matter, vol. 21, No. 40, Sep. 14, 2009, 4 pp.
Schedin et al., "Detection of individual gas molecules adsorbed on graphene," Nature Materials, vol. 6, Jul. 29, 2007, 4 pp.
Shan et al., "Direct Electrochemistry of Glucose Oxidase and Biosensing for Glucose Based on Graphene," Analytical Chemistry, vol. 81, No. 6, Mar. 15, 2009, 6 pp.
Son et al., "A Wireless Implantable Passive Microdosimeter for Radiation Oncology," IEEE Transactions on Biomedical Engineering, vol. 55, No. 6, Jun. 2008, 6 pp.
Tang et al., "An enzyme-free quartz crystal microbalance biosensor for sensitive glucose detection in biological fluids based on glucose/dextran displacement approach," Analytica Chimica Acta, vol. 686, Dec. 8, 2010, 6 pp.
Wang et al., "Atomic Layer Deposition of Metal Oxides on Pristine and Functionalized Graphene," Journal of the American Chemical Society, vol. 130, No. 26, Jul. 2, 2008, 3 pp.
Wang et al., "Graphene Frequency Multipliers," IEEE Electron Device Letters, vol. 30, No. 5, May 2009, 5 pp.
Wang et al., "Graphene-Based Ambipolar RF Mixers," IEEE Electron Device Letters, vol. 31, No. 9, Sep. 2010, 5 pp.
Wehling et al., "Molecular Doping of Graphene," Nano Letters, vol. 8, No. 1, Jan. 2008, 6 pp.

(56) References Cited

OTHER PUBLICATIONS

Xia et al., "Measurement of the quantum capacitance of graphene," Nature Nanotechnology, vol. 4, Jul. 5, 2009, 5 pp.

Zhu et al., "Carrier scattering, mobilities, and electrostatic potential in monolayer, bilayer, and trilayer graphene," Physical Review B, vol. 80, Dec. 2, 2009, 8 pp.

U.S. Appl. No. 16/905,364, filed Jun. 18, 2020, by Regents of the University of Minnesota (Inventor: Koester).

Barik et al., "Graphene-edge dielectrophoretic tweezers for trapping of biomolecules," Nature Communications, vol. 8, Issue 1, Dec. 2017, 9 pp.

Thareja et al., "Electrically Tunable Coherent Optical Absorption in Graphene with Ion Gel," ACS Publications, Nano Letters, vol. 15, Feb. 11, 2015, 7 pp.

Quarforth et al., "Ka-Band Electronically Scanned Artificial Impedance Surface Antenna," IEEE International Symposium on Antennas and Propagation (APSURSI), 2016, 2 pp. Applicant points out, in accordance with MPEP 609.04(a), that the year of publication, 2016, is sufficiently earlier than the effective U.S. filing date, so that the particular month of publication is not in issue.

Schaffner et al., "Graphene based active and passive component development on transparent substrates," Proceedings of SPIE, SPIE Digital Library, Aug. 18, 2020, 8 pp.

Ebrish et al., "Effect of Noncovalent Basal Plane Functionalization on the Quantum Capacitance in Graphene," ACS Publications, American Chemical Society, ACS Applied Materials & Interfaces, vol. 6, Applicant points out, in accordance with MPEP 609.04(a), that the year of publication, 2014, is sufficiently earlier than the effective U.S. filing date, so that the particular month of publication is not in issue, 8 pp.

Koester, "High quality factor graphene varactors for wireless sensing applications," Applied Physics Letters, vol. 99, Oct. 18, 2011, 4 pp.

Zhang et al., "Capacitive Sensing of Glucose in Electrolytes Using Graphene Quantum Capacitance Varactors," American Chemical Society, ACS Applied Materials & Interfaces, vol. 9, Oct. 12, 2017, 7 pp.

Moldovan et al., "Graphene Quantum Capacitors for High Frequency Tunable Analog Applications," American Chemical Society, ACS Publications, vol. 16, Jul. 8, 2016, 8 pp.

\* cited by examiner

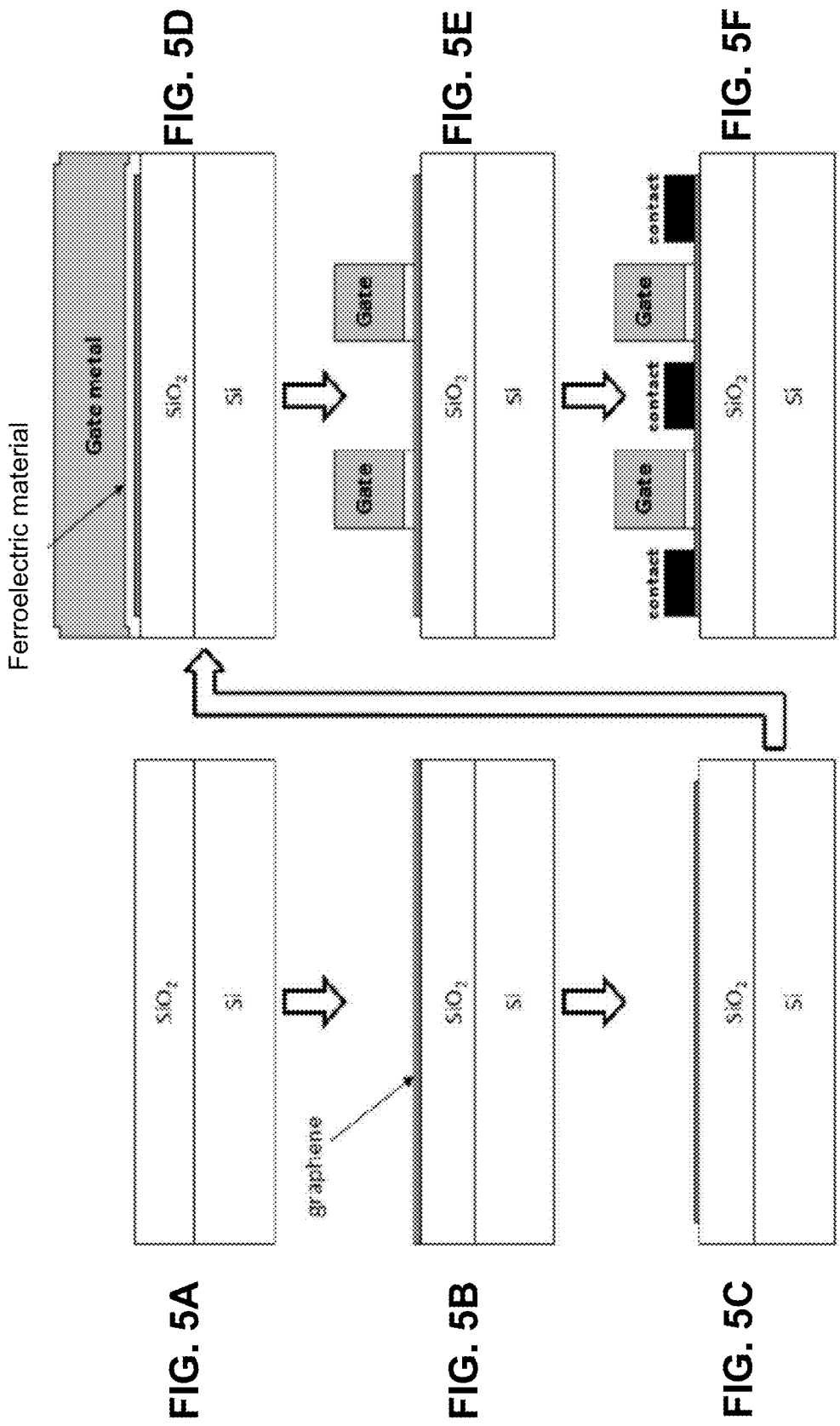

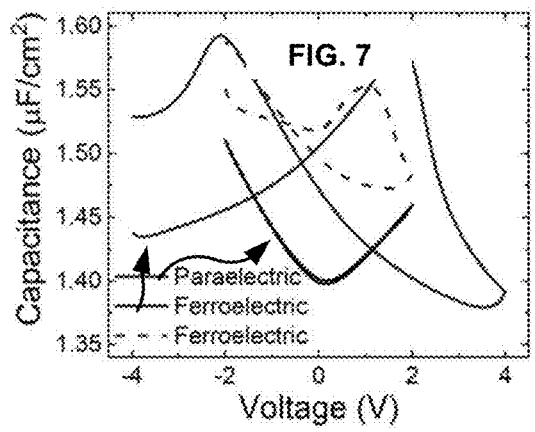
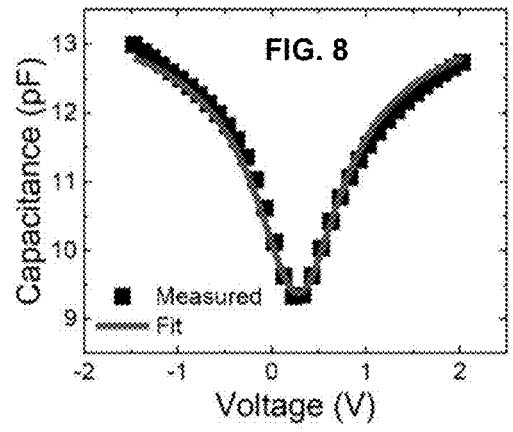
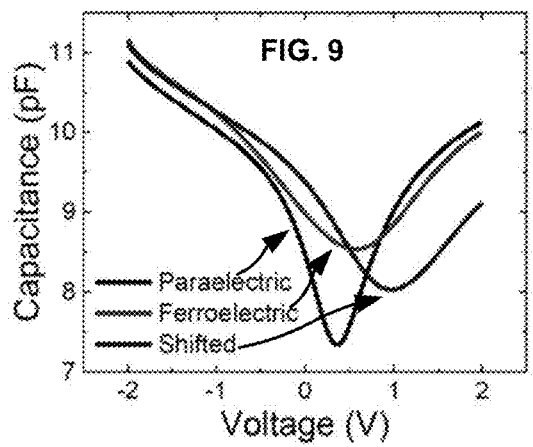
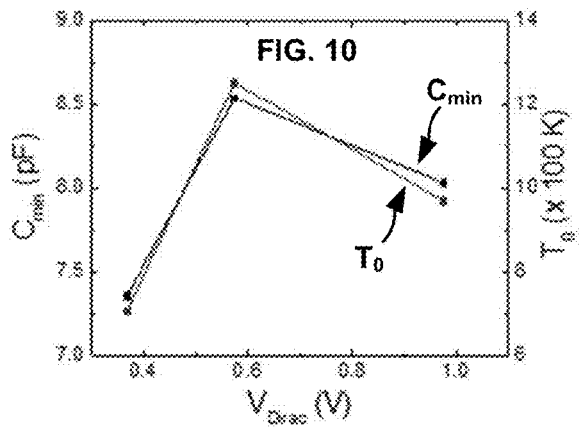
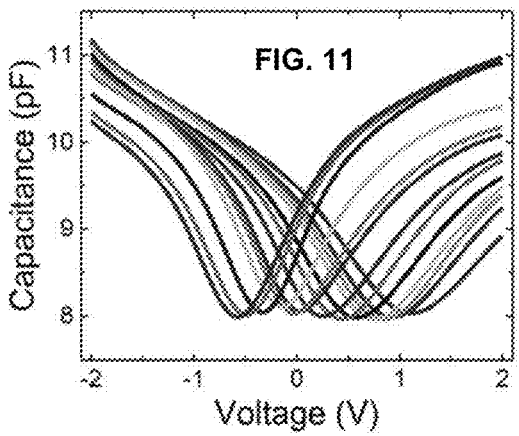
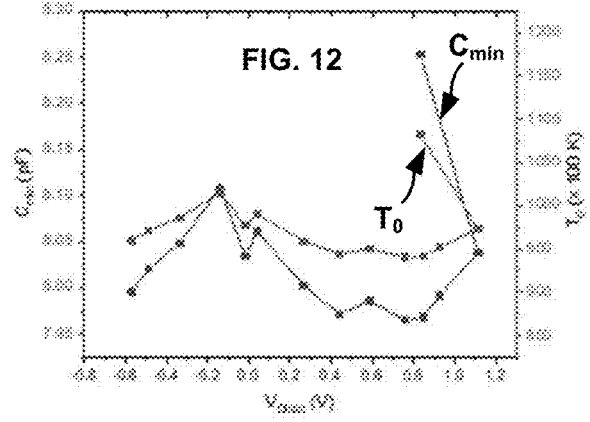

GRAPHENE VARACTOR INCLUDING FERROELECTRIC MATERIAL

This application claims the benefit of U.S. Provisional Patent Application No. 62/818,498, entitled, "GRAPHENE VARACTOR INCLUDING FERROELECTRIC MATERIAL," and filed Mar. 14, 2019. The entire contents of U.S. Provisional Patent Application No. 62/818,498 are incorporated herein by reference.

GOVERNMENT RIGHTS

This invention was made with government support under ECCS-1708275 awarded by National Science Foundation. The government has certain rights in the invention.

TECHNICAL FIELD

The disclosure relates to electrical devices including sensors.

BACKGROUND

Graphene is a recently isolated two-dimensional form of carbon that has attracted attention in the scientific community due to its unique physical properties. For instance, two-dimensional graphene has zero band gap and a linear dispersion relation near the Dirac point, where the electrons behave like massless Dirac fermions. Graphene has extraordinary transport properties: the Fermi velocity is about $10^8$ centimeters per second (cm/s) and room temperature carrier mobilities over 10,000 centimeters squared per volt-second ($cm^2/Vs$) at a sheet density of $10^{12}$ $cm^{-2}$ have been reported. Carrier mobilities over 200,000 $cm^2/Vs$ have also been measured in suspended graphene samples at low temperatures. Graphene also has tremendous mechanical strength and high thermal conductivity. Despite these attractive physical properties, the absence of a band gap has made it difficult to utilize graphene for conventional applications, such as scaled field-effect transistors (FETs) for digital logic. Furthermore, common methods of inducing a band gap in graphene, such as through the formation of nanoribbons or by placing a field across bi-layer graphene, have been shown to degrade the transport properties.

SUMMARY

This disclosure describes electrical devices that utilize the quantum capacitance effect in graphene as a functional basis of the device. The electrical devices take advantage of the relative ease with which graphene can operate in a quantum capacitance limit. The quantum (or degeneracy) capacitance, $C_Q$, is a direct consequence of the Pauli Exclusion Principle, and occurs because Fermions require a Fermi-level shift to increase or decrease their concentration in a material. The quantum capacitance can be expressed as $C_Q=e^2 dn/dE$, where $dn/dE$ is the density of states and e is the electronic charge. Since quantum capacitance is proportional to the density of states, quantum capacitance is lower in materials that have low density of states. Therefore, quantum capacitance effects are most likely to be observable in materials that have low density of states, such as graphene. Evidence of operation in the quantum capacitance regime has been demonstrated in graphene field-effect transistors, and some limited benefits of operation in the quantum capacitance regime have been noted for certain classes of field effect transistors, such as tunneling field-effect transistors (TFETs). Furthermore, graphene varactors (variable capacitors) incorporating paraelectric materials such as $HfO_2$ have been demonstrated in the literature. However, such graphene varactors are inherently volatile in that they require a gate electrode or external environmental charge to tune the capacitance. To date, no compelling device application that utilizes as its principle of operation the quantum capacitance effect in graphene and incorporates nonvolatile operation has been proposed.

The techniques described herein utilize the dependence of the density of states in graphene as a function of Fermi-level position (reaching zero at the Dirac point) and the reasonable conductivity of graphene throughout this regime due to its zero band gap and high carrier mobility. This combination of properties, along with the ability to integrate ferroelectric materials that can store a charge polarization state, allows graphene to be used as a high-quality-factor (Q) non-volatile varactor, a device that could form the basis of a new class of ultra-compact wireless, tunable elements for antennas, or the like.

In some examples, the disclosure describes a varactor including a gate electrode; a graphene layer; and a ferroelectric layer between the gate electrode and the graphene layer.

In some examples, the disclosure describes a varactor including an insulator layer defining a plurality of fingers, wherein a first finger of the plurality of fingers extends in a first direction within the insulator layer, and wherein a second finger of the plurality of fingers extends in a second direction substantially opposite to the first direction; a gate electrode in the plurality of fingers; a first graphene layer positioned over the first finger; a second graphene layer positioned over the second finger; a ferroelectric layer between the gate electrode and the first graphene layer and between the gate electrode and the second graphene layer; and at least one contact electrode formed on the first and second graphene layers and making electrical contact with the first and second graphene layers.

In some examples, the disclosure describes a method of forming a graphene quantum capacitance varactor including depositing a graphene layer on an insulator layer; depositing a ferroelectric layer on the graphene layer; depositing a gate electrode on the dielectric layer; and depositing a contact electrode on the graphene layer.

In some examples, the disclosure describes a method including etching an insulator layer to define a depression in the insulator layer; forming a gate electrode in the depression; depositing a ferroelectric layer over the gate electrode; disposing a graphene layer on the dielectric layer; and forming an electrical contact on the graphene layer.

BRIEF DESCRIPTION OF DRAWINGS

FIGS. 5A-5F are conceptual diagrams illustrating a process flow for forming a graphene varactor having a gate electrode over the graphene layer.

FIG. 7 illustrates typical ferroelectric behavior in metal-HZO (hafnium zirconate)-metal capacitor structures using CV (capacitance-voltage) curves before and after the activation of the ferroelectric domains.

FIG. 8 shows the measured and fitted CV characteristic of a typical varactor in paraelectric state, where the fitted parameters are $T_0$=726 K and equivalent oxide thickness (EOT)=4 nm.

FIG. 9 compares the CV characteristics of the same device before and after the domain activation with another curve measured after tuning the $V_{Dirac}$ to about 1V, where large shifts in the measured minimum capacitance ($C_{min}$) and reduction in the tuning ratio are observable.

FIG. 10 is a fitting result of measured $C_{min}$ and $T_0$.

FIG. 11 shows that the $V_{Dirac}$ can be fine-tuned over a large range (1.7V) of voltages without any significant loss in the tuning ratio.

FIG. 12 shows the corresponding variations in the $C_{min}$ and $T_0$.

DETAILED DESCRIPTION

This disclosure describes electrical devices that utilize the quantum capacitance effect in graphene as a functional basis of the device. Two-dimensional graphene-based devices which utilize the tunable density of states (DOS) property in graphene are being studied for a number of sensing and optical applications. Radio frequency (RF) variable capacitors (varactors) can be realized in the form of metal-oxide-graphene structures by exploiting the high carrier mobility and the above stated tunable DOS property in graphene. In wireless communication devices such as artificial impedance surface antennas, bulky Si-based bi-state PIN diodes are used that are switched ON/OFF by utilizing a voltage bias, making them unsuitable for wearable devices, low-cost 'Internet of Things' (IoT) and high-density RF analog integrated circuits. While conventional graphene varactors can potentially address the critical need for RF-compatible tunable elements, they would still need a power supply. Described herein are graphene varactors integrated with ferroelectric material, such as Hafnium Zirconate (HfZrO$_2$ or HZO), that allow an independent method of tuning of the Dirac point. For example, graphene varactors integrated with ferroelectric material described herein may enable a tuning ratio of about 1.5 and display Dirac point ($V_{Dirac}$) tunability of 1.7V in a ±2V sweep. Furthermore, when operated at zero-bias (zero gate voltage), a tuning ratio of 1.2 is enabled, showing that the graphene varactors are thus reconfigurable, and do not require a continuous bias voltage to be applied in order to achieve capacitance tuning. In some examples, the varactors may be used in electrical devices including wireless sensors, communication devices, or the like.

Figure 1B:
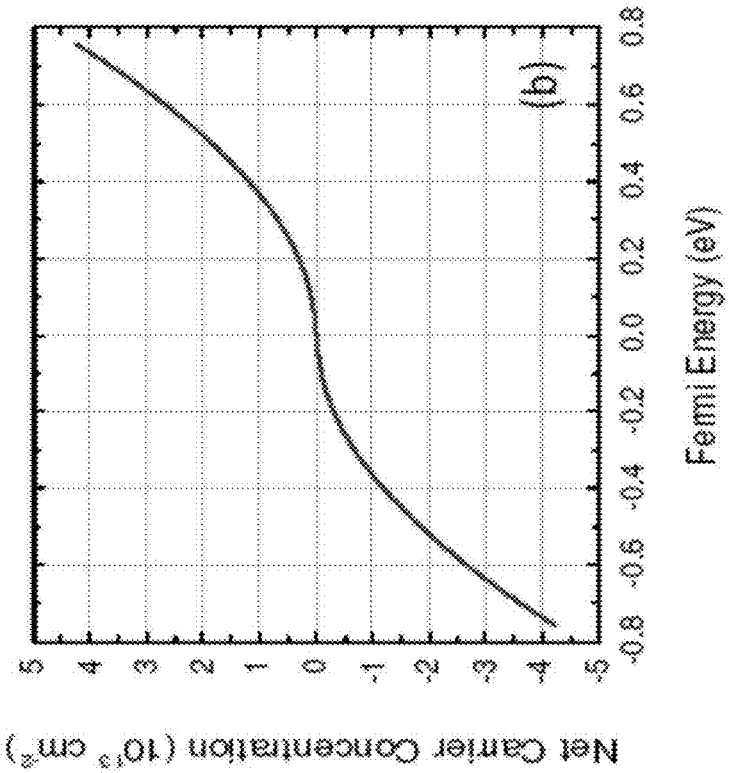
FIGS. 1A and 1B are example line diagrams that illustrate, respectively, theoretical total carrier concentration and net carrier concentration in graphene at 300 Kelvin (K) as a function of Fermi energy.
Figure 1A:
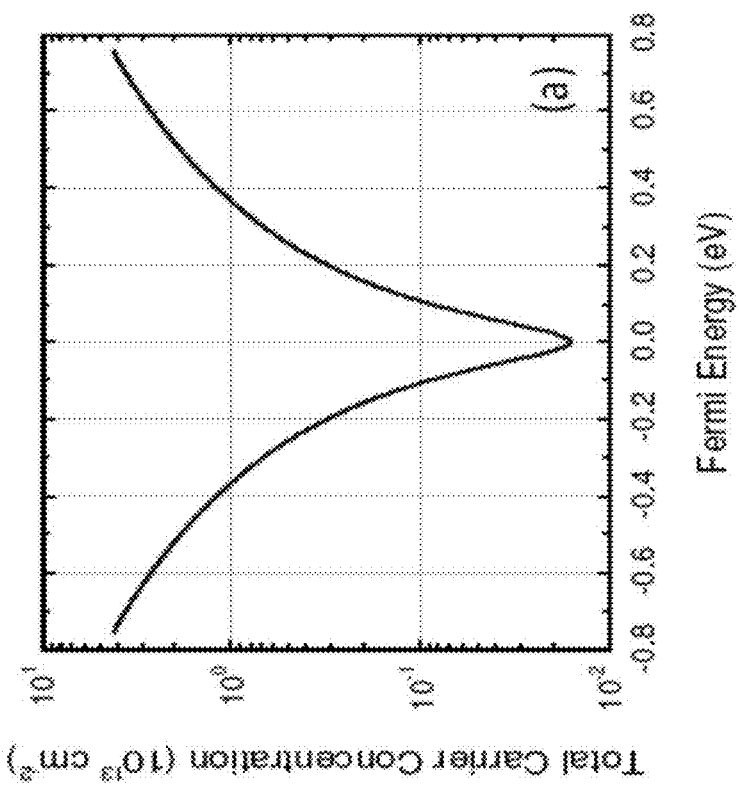

The energy-dependent density of states in graphene, ρgr (E), can be expressed as $$\rho_{gr}(E) = \frac{g_s g_v}{2\pi(\hbar v_F)^2}|E| \tag{1}$$

where $g_s$ and $g_v$ are the spin and valley degeneracies, respectively, E is the energy relative to the Dirac point, $v_F$ is the Fermi velocity, and ℏ is the reduced Planck's constant. For graphene, $g_s$=2, $g_v$=1 and $v_F$=10$^8$ cm/sec. The relation in equation (1) indicates that graphene has a density of states that varies linearly in energy and vanishes at the Dirac point. The carrier concentration can be determined from the density of states by multiplying (1) by the occupation probability and integrating over energy. The electron and hole concentrations, n and p, respectively, can be expressed as:

$$n = \frac{2}{\pi}\left(\frac{kT}{\hbar v_F}\right)^2 \mathcal{J}(+\eta) \tag{2}$$

$$p = \frac{2}{\pi}\left(\frac{kT}{\hbar v_F}\right)^2 \mathcal{J}(-\eta) \tag{3}$$

where $$\mathcal{J}_j(\eta) = \frac{1}{\Gamma(j+1)} \cdot \int_0^\infty \frac{u^j}{1+e^{u-\eta}} \cdot du \tag{4}$$

k is Boltzmann's constant, T is temperature and η is $E_F$/kT, where $E_F$ is the Fermi energy. The two main features of the carrier statistics in graphene are shown in FIGS. 1A and 1A. In FIG. 1A, the total carrier concentration, $n_{tot}$=n+p is plotted, while the net carrier concentration, $n_{net}$=n−p is shown in FIG. 1B. FIGS. 1A and 1B show that even when the net carrier concentration in graphene goes to zero (e.g., at zero Fermi Energy), the total carrier concentration, which determines the conductivity, remains finite.

Figure 2:
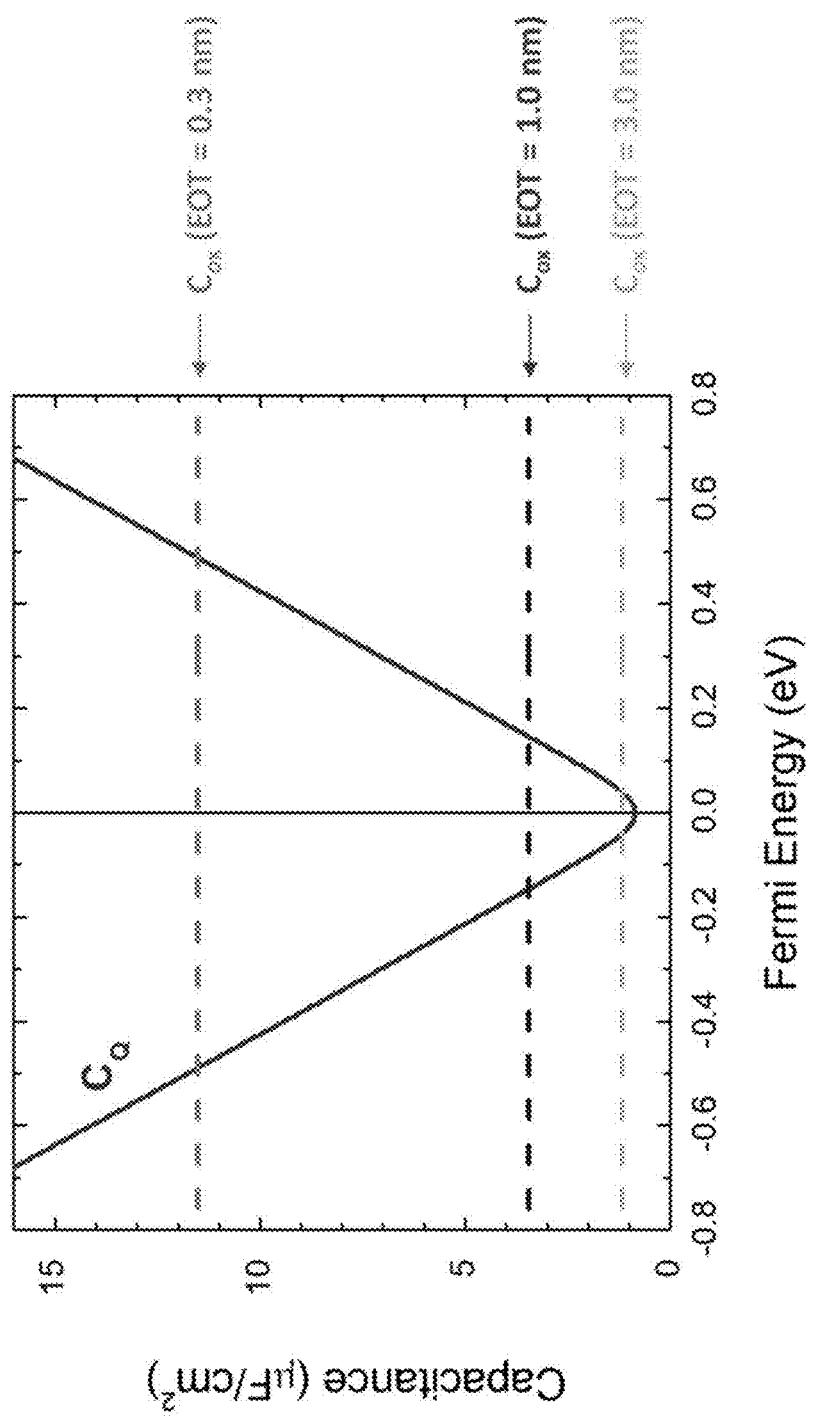
FIG. 2 is an example line diagram that illustrates a plot of theoretical quantum capacitance and oxide capacitance for three different values of effective oxide thickness (EOT) versus Fermi energy at 300 K.

From the relations in (2) and (3), the quantum capacitance, $C_Q$, can be determined as:

$$C_Q = \frac{2q^2 k_B T_{eff}}{\pi(\hbar v_f)^2} \ln\left[2 + 2\cosh\left(\frac{E_F}{kT_{eff}}\right)\right] \tag{5a}$$

where e is the electronic charge and $$T_{eff} = \sqrt{T_0^2 + T^2} \tag{5b}$$

Where $T_{eff}$ is the effective temperature, T is the lattice (ambient) temperature and the parameter $T_0$ is a measure of the electronic disorder in the graphene. A plot of $C_Q$ vs. $E_F$ is shown in FIG. 2, where the value of $C_Q$ is compared with values of oxide capacitances for various values of the equivalent oxide thickness (EOT). The plot in FIG. 2 shows that $C_Q$ in graphene can be on the order of the oxide capacitance for some readily achievable values of EOT, 0.3 nm, 1.0 nm, and 3.0 nm. In some examples, the EOT of a varactor may be less than about 5 nm, such as less than about 2 nm, or about 1 nm. Since the total capacitance is determined by the series combination of $C_{ox}$ and $C_Q$, the total capacitance can be modulated by an amount on the order of $C_{ox}/C_{Qmin}$, where $C_{Qmin}$=0.843 μF/cm$^2$ at 300 K. When EOT is less than about 1 nm, this corresponds to capacitance modulation ratios greater than about 4, and these values could be sufficient to allow graphene to be used as a varactor in a wireless readout circuit.

For the quantum capacitance effect to be useful for high-frequency applications, it is not enough that the capacitance can be varied. The device also has to be able to maintain a high quality factor (Q), so that the varactor can be utilized as part of an antenna or resonant LC circuit.

The Q of a capacitor is the reciprocal of the product of its charging delay and the operating frequency (which will ultimately be determined by the size of the inductor in the LC circuit) Q can be expressed as:

$$Q = \frac{1}{2\pi RCf} \quad (6)$$

Since the magnitude of the capacitance, C, and frequency, f, will be predetermined by the resonant circuit, one practical method to increase Q is to reduce the resistance, R. It is in reducing R where the properties of graphene are suited. The absence of a band gap means that the conductivity of graphene remains reasonably high throughout the entire tuning range. In other words, even when the net charge in the graphene is zero (as shown in FIG. 1B), the total number of carriers available for conduction remains finite (as shown in FIG. 1A, since it consists of a combination of electrons and holes), and such a situation can only occur in a material where band gap energy ($E_g$) is much less than kT (the thermal energy). In graphene, the conductivity drops near the Dirac point (this is the mechanism by which graphene FETs operate), so the remaining channel resistivity is decreased in order to increase the Q.

FIGS. 3A-3D are schematic layouts of example graphene varactors that include a ferroelectric layer between a gate electrode and a graphene layer.

Figure 3A:
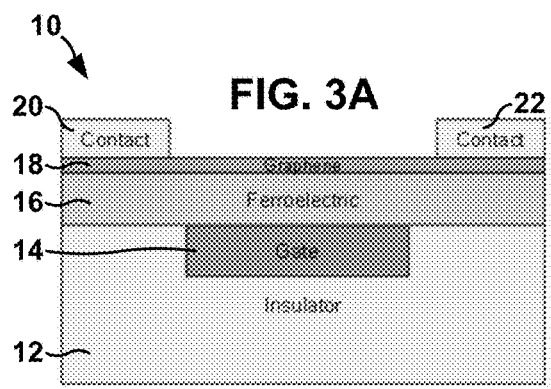
FIGS. 3A-3D are schematic layouts of example graphene varactor geometries.

The example varactor 10 shown in FIG. 3A includes an insulator material 12. Insulator material 12 may include any suitable electrically insulating material. In some examples, insulator material 12 includes a semiconductor material, such as silicon; an electrically insulating material such as quartz, sapphire, or the like; or a two-layer structure including a semiconductor material, such as silicon, and an oxide layer on the semiconductor material, such as silica ($SiO_2$). In some examples, the oxide layer may be a thermally grown oxide layer on the semiconductor.

Varactor 10 also includes a gate electrode 14 recessed into insulator material 12. In other examples, gate electrode 14 may be partially recessed into insulator material 12 or may be formed on a planar surface of insulator material 12. In examples in which gate electrode 20 is recessed in insulator material 12, gate electrode 14 may be formed by etching a depression in insulator material 12 and then depositing an electrically conductive material in the depression to form gate electrode 14. Gate electrode 14 may be formed from any suitable electrically conductive material, including, for example, polysilicon; a silicide material; a metal composite, such as a metal nitride; a metal, such as Ti, Pd; or the like.

Varactor 10 also includes ferroelectric layer 16 disposed on gate electrode 14 and insulator material 12. Ferroelectric layer 16 may include any suitable ferroelectric material, including for example, $Hf_{1-x}Zr_xO_2$ (hafnium zirconate), $Hf_{1-x}Al_xO_3$ (hafnium aluminate), $Hf_{1-x}La_xO_3$ (hafnium lanthanate), $BaTiO_3$ (barium titanate), $PbZr_xTi_{1-x}O_3$, $Ba_{1-x}Sr_xTiO_3$, or the like. In some examples, the ferroelectric material may include hafnium zirconate (($Hf_{1-x}Zr_x)O_2$).

Ferroelectric layer 16 may define any suitable thickness. In some examples, the thickness may be less than about 100 nm, such as tens of nanometers. In some implementations, the thickness may be between about 2 nm and about 20 nm. Ferroelectric layer 16 may be formed using any suitable technique, including atomic layer deposition or other vapor deposition processes. In some examples, ferroelectric layer 16 may be heated following deposition to anneal ferroelectric layer 16.

Ferroelectric layer 16 exhibits remnant polarization at zero bias voltage after application of an electric field or voltage or sufficiently high magnitude. The remnant polarization enables controlling the Dirac point by applying a sufficiently high voltage pulse to induce remnant polarization. Once the remnant polarization is induced in ferroelectric layer 16, ferroelectric layer 16 may act like a dielectric material within a voltage range. In this way, the Dirac point may be controlled without a constantly applied bias voltage. Further, in some examples, the varactor may act as a non-volatile variable capacitor.

In some examples, ferroelectric layer 16 exhibits a coercive field strength of between about 2 and about 3 MV/cm and a remnant polarization of between about 10 $\mu C/cm^2$ and about 20 $\mu C/cm^2$. In other examples, ferroelectric layer 16 exhibits a coercive field strength of between about 1 MV/cm and about 2 MV/cm and a remnant polarization of between about 20 $\mu C/cm^2$ and about 30 $\mu C/cm^2$ Varactor 10 also includes graphene layer 18 disposed on ferroelectric layer 16. In some examples, graphene layer 18 consists of a graphene monolayer. In some examples, graphene layer 18 may be formed separate from varactor 10 and transferred onto ferroelectric layer 16. For example, graphene layer 18 may be synthesized on a metal foil, such as a Cu foil, removed from the metal foil by etching the metal, then transferred onto ferroelectric layer 16 using a wet transfer method.

Varactor 10 also includes electrical contacts 20 and 22 electrically contacting graphene layer 18. However, unlike a conventional field effect transistor, the "source" and "drain" electrical contacts 20 and 22 are shorted together. Electrical contacts 20 and 22 may be formed using any suitable electrically conductive material, including, for example, gold, copper, aluminum, chromium, palladium, or the like.

Although not shown in FIG. 3A, a thin protective insulator layer may be formed on graphene layer 18, e.g., on the exposed surface on the side of graphene layer 18 opposite to ferroelectric layer 16. Example materials from which the thin protective insulator layer may be formed include silicon dioxide ($SiO_2$), aluminum oxide ($Al_2O_3$), hafnium oxide ($HfO_2$), or the like.

Figure 3B:
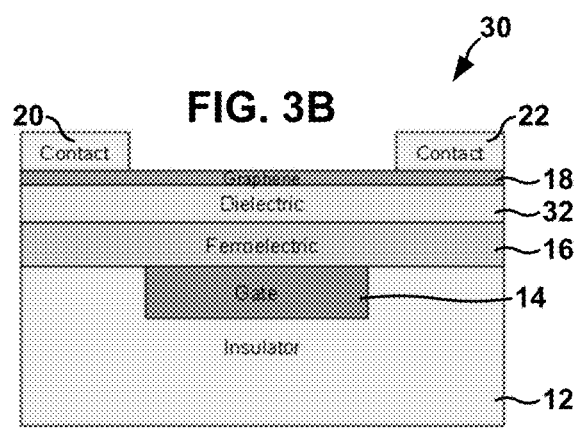

In some examples, rather than including only ferroelectric layer 16 between gate electrode 14 and graphene layer 18, a varactor may include at least one layer of dielectric material between gate electrode 14 and graphene layer 18. For example, FIG. 3B illustrates a varactor 30 in which a dielectric layer 32 is between ferroelectric layer 16 and graphene layer 18. Dielectric layer 32 may include any suitable dielectric material, such as a high-κ dielectric material. Example high-κ dielectric materials, include, for example, silica ($SiO_2$) aluminum oxide ($Al_2O_3$), hafnium dioxide ($HfO_2$), or zirconium dioxide ($ZrO_2$).

Figure 3C:
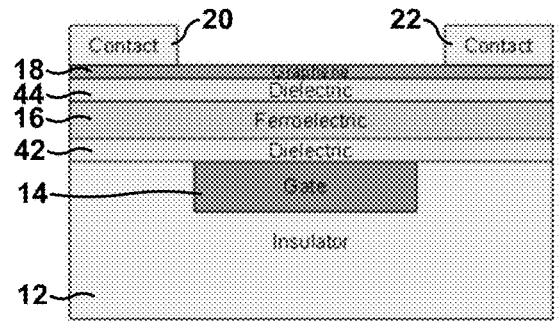

In other examples, as shown in FIG. 3C, a varactor 40 may include a dielectric layer on both sides of ferroelectric layer 16. First dielectric layer 42 is between gate electrode 14 and ferroelectric layer 16 and second dielectric layer 44 is between ferroelectric layer 16 and graphene layer 18. Each of first and second dielectric layers 42 and 44 may include any suitable dielectric material, such as a high-κ dielectric material. First and second dielectric layers 42 and 44 may include the same dielectric material or different dielectric materials. Similarly, first and second dielectric layers 42 and 44 may define the same thickness or different thicknesses.

Figure 3D:
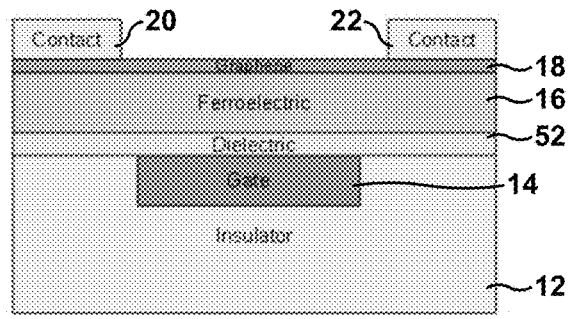

FIG. 3D illustrates another example varactor 50 that includes a dielectric layer 18 between gate electrode 14 and graphene layer 18. Unlike varactor 30, dielectric layer 52 in varactor 50 is between gate electrode 14 and ferroelectric layer 16.

In some examples, despite the fact that graphene has a finite conductivity, the channel resistance could be high enough to degrade the Q of the varactor, particularly near the Dirac point. In order to lower possible series resistance, a multi-finger varactor geometry may be used. The multi-finger geometry serves two main purposes. First, it allows the total gate capacitance to be increased while allowing the gate length to remain small. Maintaining a short gate length may reduce the distance carriers need to travel between the center of the channel and the contacts. Secondly, the multi-finger geometry substantially reduces the resistance associated with the gate fingers, because the fingers are effectively connected in parallel with each other.

FIGS. 4A-4D are conceptual diagrams of an example process of forming a multi-finger. In some examples, the process may include first defining a depression 64 in an insulator layer 62. In some examples, insulator layer 62 includes an $SiO_2$ layer. The $SiO_2$ may be grown on a silicon substrate (not shown in FIG. 4A to any suitable thickness. For example, the $SiO_2$ layer may be up to about 500 nm thick, such as about 475 nm thick. In some instances, the $SiO_2$ layer may be thermally grown on an n-type silicon substrate.

Figure 4A:
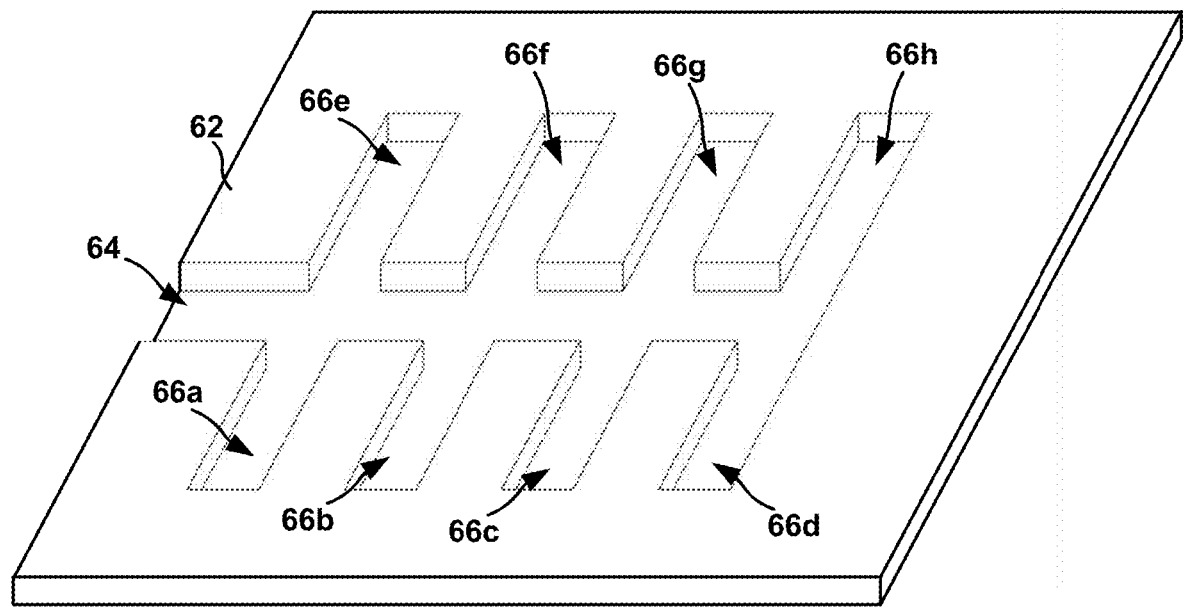
FIGS. 4A-4D are conceptual diagrams that illustrate an example technique for forming a multi-fingered graphene varactor including a ferromagnetic layer.

Depression 64 may be defined using optical contact lithography and buffered oxide etching. The shape of depression 64 may generally correspond to a shape of a gate electrode. For example, depression 64 includes eight fingers 66a-66h. In other examples, depression 64 may include more of fewer fingers, depending on the number of fingers that the gate contact 68 (FIG. 4B) is to include. In the example shown in FIG. 4A, depression 64 defines a shape including four fingers 66a-66d that extend substantially parallel to each other in a first direction and four fingers 66e-66h that extend substantially parallel to each other in a second direction. In the example of FIG. 4A, the first direction is substantially opposite to the second direction.

Figure 4B:
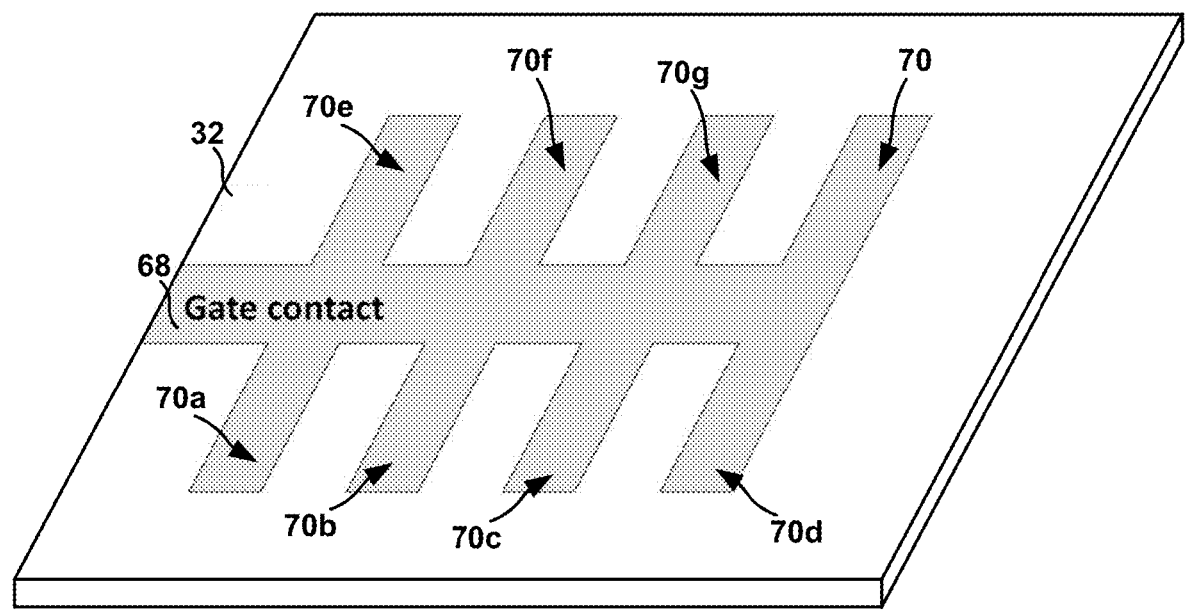

As shown in FIG. 4B, electrically conductive material is deposited in depression 64 to form gate contact 68 (or gate electrode 68). The material may substantially fill depression 64, e.g., including the eight fingers 66a-66h to form a gate contact 68 with a corresponding number of fingers 70a-70h. The material used to form gate contact 68 may be electrically conductive, such as copper, gold, silver, tungsten, aluminum, titanium, palladium, platinum, iridium, or an alloy including at least one of copper, gold, silver, tungsten, aluminum, titanium, palladium, platinum, iridium, or the like. In some implementations, gate electrode 68 may include a 10 nm layer of titanium and a 40 nm layer of palladium.

In some examples, after depositing the material used to form gate contact 68, a surface of gate contact 68 and insulator layer 62 may be subjected to processing to smooth the surface of gate contact 88 and insulator layer 62 and form a substantially planar surface. For example, chemical mechanical polishing (CMP) may be used to smooth the surfaces. As shown in FIG. 4B, gate contact 68 includes eight gate electrode fingers 70a-70h. In other examples, gate contact 68 may include fewer than eight gate electrode fingers 70a-70h or more than eight gate electrode fingers 70a-70h. For example, gate contact 78 may include at least two gate electrode fingers.

After gate contact 68 has been formed, a ferroelectric layer is formed over gate contact 68 (not shown in FIGS. 4A-4D). For example, a 15 nm layer of hafnium zirconate may be deposited at 250° C. using atomic layer deposition. In some examples, the ferroelectric layer may be annealed, for example, at 550° C. for one minute in an inert atmosphere.

Additionally and optionally, at least one dielectric layer (not shown in FIGS. 4A-4D) may be formed over gate contact 68 (e.g., between gate contact 68 and the ferroelectric layer, on the ferroelectric layer, or both). For example, the at least one dielectric layer may be deposited using atomic layer deposition.

Figure 4C:
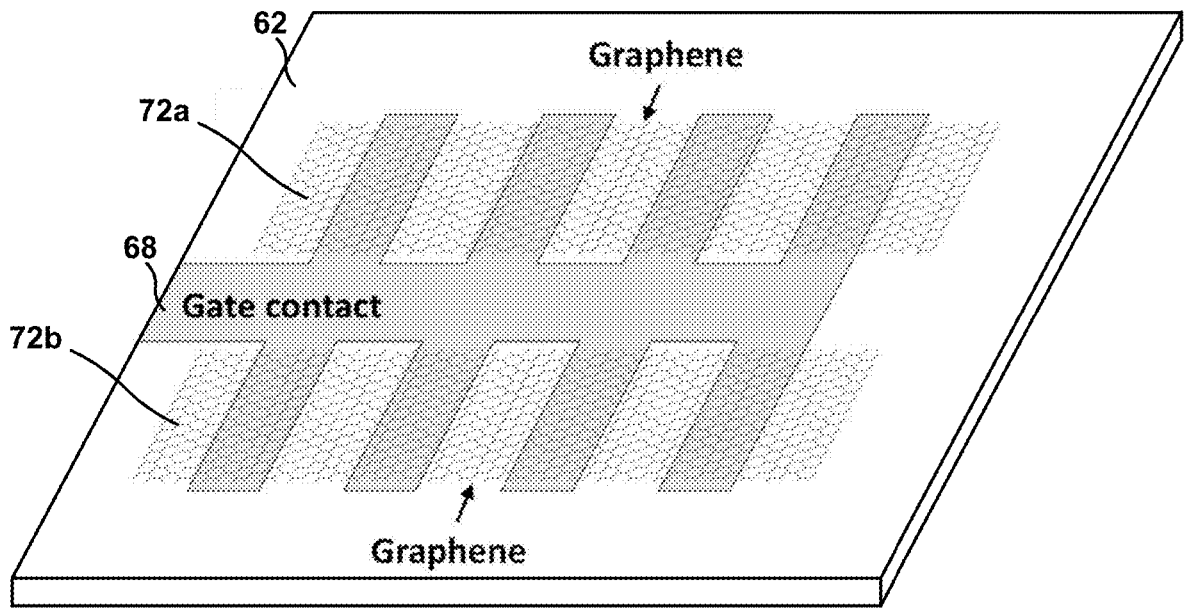

At least one graphene layer 72 may be positioned over the ferroelectric layer and gate contact 68 (e.g., over the dielectric layer) and portions of insulator layer 62, as shown in FIG. 4C. In the example of FIG. 4C a first graphene layer 72a is positioned over gate contact fingers 70e-70h (see FIG. 4B) and a second graphene layer 72b is positioned over gate contact fingers 70a-70d. In some examples, one or both of first graphene layer 72a and second graphene layer 72b may consist of a graphene monolayer. In other implementations, a single graphene layer 72 or more than two graphene layers 72 may be used in a graphene varactor.

In some examples, the graphene layers 72 are grown using chemical vapor deposition (CVD) on a copper foil. The graphene layers 72 may be coated with poly(methyl methacrylate) (PMMA), and the copper removed using iron(III) chloride ($FeCl_3$). The coated graphene layers 72 are then positioned over the ferroelectric layer and portions of insulator layer 62 using an aqueous transfer process. The PMMA may be removed using solvent cleaning. In some examples, in which graphene layers 72 are cut to a different shape, oxygen plasma etching is used to etch the graphene layers 72.

Figure 4D:
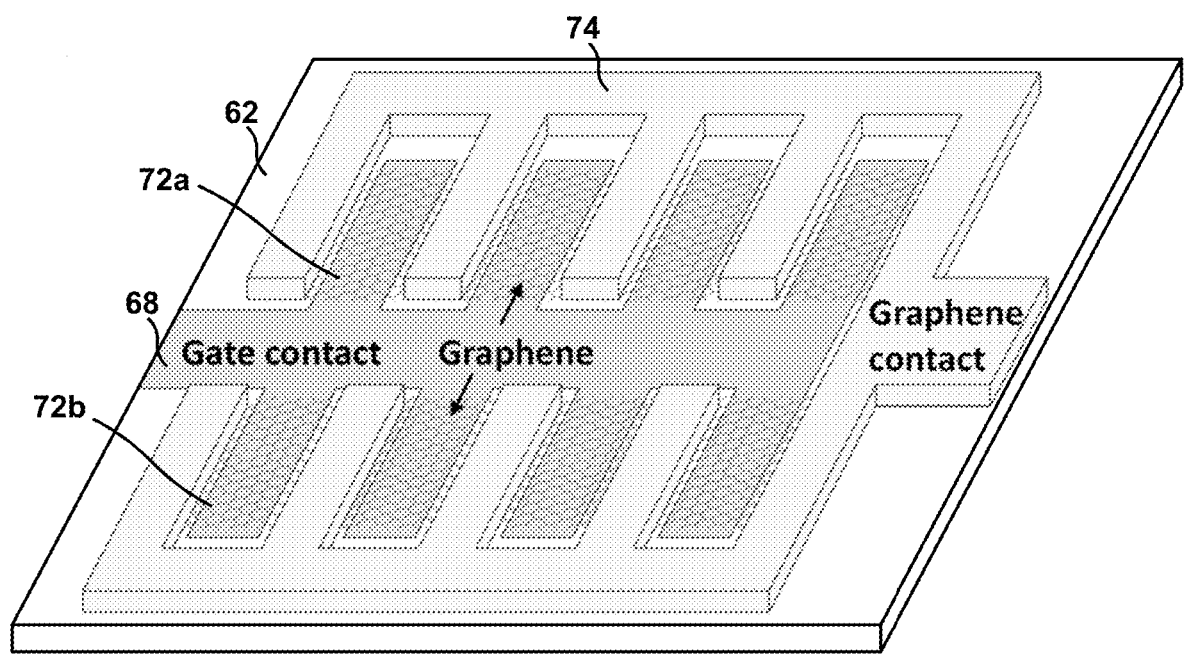

As shown in FIG. 4D, contact electrode 74 is formed on portions of graphene layers 72 and portions of insulator layer 62. Contact electrode 74 includes electrically conductive material, such as copper, gold, silver, tungsten, aluminum, titanium, palladium, platinum, iridium, or an alloy including at least one of copper, gold, silver, tungsten, aluminum, titanium, palladium, platinum, iridium, or the like. In some examples, contact electrode 74 includes a 10 nm layer of chromium and an 80 nm layer of gold. Contact electrode 74 may be formed using patterning and lifting off processes.

In some examples, rather than the gate electrode being under the graphene layer, the gate electrode may be over the graphene layer. FIGS. 5A-5F are conceptual diagrams illustrating a process flow for forming a graphene varactor having a gate electrode over the graphene layer. The same materials described above with respect to FIGS. 3A-3D may be used for corresponding layers of the device shown in FIGS. 5A-5F. The process begins with a silicon substrate covered with a silicon dioxide layer (an insulator layer) as shown in FIG. 5A. In other examples, instead of a silicon substrate covered with a silicon dioxide layer, an insulator, such as sapphire or quartz, may be used. Next, graphene is deposited onto the substrate FIG. 5B. The graphene may be formed using, for example, CVD or exfoliation. In some cases, relatively large pieces (e.g., greater than 20 μm by 20 μm) of single-layer graphene may be used. Such graphene pieces could produce capacitances on the order of a few pF, which is high enough to allow characterization of LC circuits. In some examples, the graphene is single-layer and not bilayer or multi-layer, since each layer increases the density of states, increasing $C_Q$ and reducing the tuning range. For this reason, CVD graphene grown on Cu foils and transferred onto SiO$_2$, quartz, or sapphire substrates may be used. Because the CVD graphene growth technique is a self-limiting process, very large single-layer graphene sheets can be realized. The graphene may be patterned into the desired geometry using optical lithography and etching as shown in FIG. 5C.

The process also includes depositing a ferroelectric material over the graphene layer and a gate metal over the ferroelectric material, as shown in FIG. 5D. The process optionally may include depositing a dielectric between the graphene layer and the ferroelectric material, between the ferroelectric material and the gate metal, or both. The gate metal, ferroelectric material, and optional dielectric then may be patterned and etched as shown in FIG. 5E. Contact electrodes then may be deposited and etched as shown in FIG. 5F. Electron-beam lithography may be used for patterning and etching the gate stack and contact electrodes, and feature sizes down to 20 nm are possible with comparable alignment tolerances.

Figure 6:
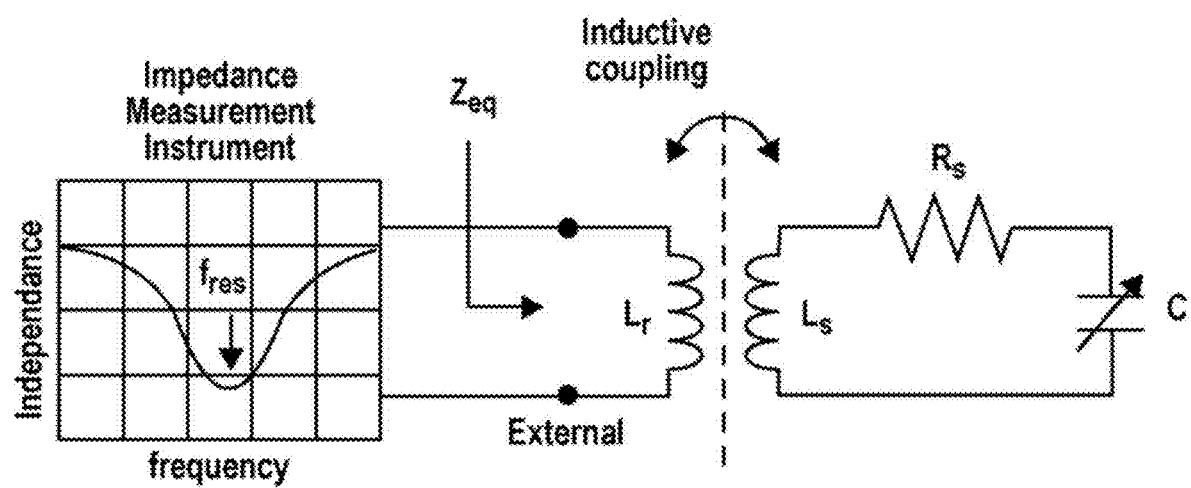
FIG. 6 is a conceptual diagram of an example wireless detection system that includes a graphene varactor.

FIG. 6 illustrates an example wireless detection system in which a graphene varactor (C) is connected to a first inductor ($L_s$) of an LC oscillator circuit. Any sense charge collected by the graphene varactor changes the capacitance of the graphene varactor, which in turn, changes the resonant frequency of the LC oscillator circuit. Sample information can be determined using a second "external" inductor ($L_r$), which is coupled to the first inductor through mutual magnetic field coupling (mutual inductance), via a "phase-dip" technique. Other, more sophisticated, wireless detection schemes are also possible.

Reducing the contact resistance may aid device performance. The contact resistance of metals to single-layer graphene may be optimized. In optimizing the contacts, varactors have a different set of constraints compared to conventional graphene FETs. In FETs, the conductivity is only modulated under the gate electrode, and so the contact resistance remains constant over the entire regime of device operation. However, in the varactor, the contact resistance could change depending upon the charge state of the ferroelectric and surrounding dielectric materials. In the configuration shown in FIG. 5F, trapped charge in the surrounding ferroelectric and dielectric layers will not only affect the conductance under the gate electrode, but also under contacts. This change in the conductance could affect the contact resistance, particularly when the net carrier concentration is near zero. Fortunately, the sensitivity of the varactor performance to the contact resistance is greatest at high carrier concentrations; therefore, it may be acceptable for the device operation if the contact resistance increases with decreasing carrier concentration.

An additional advantage for the varactors compared to FETs is that they can operate using either electrons or holes as the dominant channel carriers, and so the contacts need to be optimized for one or the other carrier types, but not both. This is important, particularly since several chemical doping methods have been developed that provide high p-type doping, but fewer techniques have been developed to produce n-type doping. The sensing geometry may also be important for improving the contact resistance, and use of an inverted structure could be beneficial in reducing the dependence of the contact resistance on the sense charge.

A varactor having the buried oxide device geometry may be used as a radiation sensor. In the graphene varactor, the buried SiO$_2$ acts as a collection layer for radiation-induced charge where extremely-small size is essential. For example, a radiation sensor that utilizes a graphene varactor may be utilized for dosimeters in radiation cancer therapy, providing significant form-factor (e.g., size) advantages over current MEMS-based solutions. In some examples, the miniature dosimeter may provide real-time feedback in radiation dosimetry.

A graphene varactor could have substantial and immediate impact. The varactors could have applications in capacitance-based sensors where the ability to tune the Dirac point could allow sensors to operate in the regime of highest sensitivity more easily than in conventional varactors.

The graphene varactor also may be used as a tuning device, e.g., for a radio frequency analog integrated circuit. Varactors integrated into such tunable circuits could have important applications for use in autonomous vehicles and in low-power wireless communication circuits. The ability to continuously tune the capacitance without continuously applying a voltage could greatly reduce the circuit complexity.

Clause 1: A varactor comprising: a gate electrode; a graphene layer; and a ferroelectric layer between the gate electrode and the graphene layer.

Clause 2: The varactor of clause 1, further comprising a dielectric material between the ferroelectric layer and the graphene layer.

Clause 3: The varactor of clause 1 or 2, further comprising a dielectric material between the gate electrode and the ferroelectric layer.

Clause 4: The varactor of any one of clauses 1 to 3, further comprising an insulator layer, wherein the gate electrode is recessed in the insulator layer, and wherein the ferroelectric layer is over the gate electrode and the insulator layer.

Clause 5: The electrical device of clause 4, wherein the at least one graphene quantum capacitance varactor further comprises a protective insulator on an exposed surface of the graphene layer opposite the ferroelectric layer.

Clause 6: The varactor of any one of clauses 1 to 3, further comprising an insulator layer, wherein the graphene layer is over the insulator layer, wherein the ferroelectric layer is over the graphene layer, and wherein the gate is over the ferroelectric layer.

Clause 7: The varactor of any one of clauses 1 to 6, wherein the ferroelectric layer comprises a hafnium-based ferroelectric.

Clause 8: The varactor of any one of clauses 1 to 6, wherein the ferroelectric layer comprises at least one of hafnium zirconate, hafnium lanthanate, or barium titanate.

Cause 9: The varactor of any one of clauses 1 to 8, wherein the graphene layer comprises a graphene monolayer.

Clause 10: The varactor of any one of clauses 1 to 9, further comprising at least two electrical contacts in electrical contact with the graphene layer.

Clause 11: The varactor of any of clauses 1 to 10, wherein the varactor is formed as a multi-finger structure comprising at least two gate electrode fingers, and wherein each of the at least two gate electrode fingers is electrically connected in parallel with the others of the at least two gate electrode fingers.

Clause 12: The varactor of any of clauses 1 to 11, further comprising an inductor electrically connected to the at least one graphene quantum capacitance varactor, wherein the inductor and the at least one graphene quantum capacitance varactor form an LC oscillator circuit having a resonant frequency responsive to a sense charge collected by the at least one graphene quantum capacitance varactor.

Clause 13: A varactor comprising: an insulator layer defining a plurality of fingers, wherein a first finger of the plurality of fingers extends in a first direction within the insulator layer, and wherein a second finger of the plurality of fingers extends in a second direction substantially opposite to the first direction; a gate electrode in the plurality of fingers; a first graphene layer positioned over the first finger; a second graphene layer positioned over the second finger; a ferroelectric layer between the gate electrode and the first graphene layer and between the gate electrode and the second graphene layer; and at least one contact electrode formed on the first and second graphene layers and making electrical contact with the first and second graphene layers.

Clause 14: The varactor of clause 13, further comprising a dielectric material between the ferroelectric layer and the graphene layer.

Clause 15: The varactor of clause 13 or 14, further comprising a dielectric material between the gate electrode and the ferroelectric layer.

Clause 16: The electrical device of any one of clauses 13 to 15, wherein the at least one graphene quantum capacitance varactor further comprises a protective insulator on an exposed surface of the graphene layer opposite the ferroelectric layer.

Clause 17: The varactor of any one of clauses 13 to 16, wherein the ferroelectric layer comprises a hafnium-based ferroelectric.

Clause 18: The varactor of any one of clauses 13 to 16, wherein the ferroelectric layer comprises at least one of hafnium zirconate, hafnium lanthanate, or barium titanate.

Clause 19: The varactor of any one of clauses 13 to 17, wherein the graphene layer comprises a graphene monolayer.

Clause 20: The varactor of any of clauses 13 to 18, further comprising an inductor electrically connected to the at least one graphene quantum capacitance varactor, wherein the inductor and the at least one graphene quantum capacitance varactor form an LC oscillator circuit having a resonant frequency responsive to a sense charge collected by the at least one graphene quantum capacitance varactor.

Clause 21: A method of forming a graphene quantum capacitance varactor comprising: depositing a graphene layer on an insulator layer; depositing a ferroelectric layer on the graphene layer; depositing a gate electrode on the dielectric layer; and depositing a contact electrode on the graphene layer.

Clause 22: A method comprising: etching an insulator layer to define a depression in the insulator layer; forming a gate electrode in the depression; depositing a ferroelectric layer over the gate electrode; disposing a graphene layer on the dielectric layer; and forming an electrical contact on the graphene layer.

Clause 23: The method of clause 21 or 22, further comprising: forming an inductor including a first end and a second end; and electrically connecting the first end to the gate electrode and the second end to the contact electrode.

Clause 24: The method of any one of clauses 21 to 23, further comprising exposing at least the dielectric layer to a voltage pulse to include remnant polarization in the dielectric layer.

Clause 25: The method of any one of clauses 21 to 24, further comprising forming a dielectric material between the ferroelectric layer and the graphene layer.

Clause 26: The method of any one of clauses 21 to 25, further comprising forming a dielectric material between the gate electrode and the ferroelectric layer.

EXAMPLES

A graphene varactor was fabricated as follows. An insulator layer of about 475 nm thick $SiO_2$ was grown on a high-resistivity (>10 k$\Omega$-cm) silicon substrate using thermal oxidation. Photolithography resist patterns and a combination of dry and wet etching was used to recess the $SiO_2$, and planar multi-finger bottom-gate structures were created by evaporating and lifting off of 10 nm of Ti followed by 35 nm of Pd, where Pd was the gate work-function metal. A ferroelectric layer of 15 nm of hafnium zirconate was then deposited at 250° C. using atomic layer deposition and annealed at 550° C. for 1 min in an inert (argon) atmosphere. Chemical vapor deposited monolayer graphene was synthesized on a copper foil at 1050° C. and transferred onto the substrate using standard wet transfer method, after etching the copper in a 7 g/L $(NH_4)_2S_2O_8$ solution. Oxygen plasma etching was used to form the graphene mesa and channel regions. Finally, Cr (10 nm)/Au (80 nm) source/drain (S/D) ohmic contacts were evaporated and lifted-off, where Cr was the contact metal. The resulting structure was like that shown in FIG. 3A.

All measurements were performed under vacuum (<1× $10^{-6}$ Torr) at 297 K using an Agilent B1500A semiconductor parameter analyzer in a Lakeshore CPX-VF cryogenic probe station, after an overnight vacuum bake at 383 K, in order to remove the effect of moisture trapped near the graphene interfaces. FIG. 7 illustrates typical ferroelectric behavior in metal-HZO-metal capacitor structures using CV (capacitance-voltage) curves before (paraelectric curve) and after the activation of the ferroelectric domains. It was observed that paraelectric to ferroelectric transition occurs only after subjecting the device to larger gate voltages than the coercive voltage. As shown by the dashed line, the ferroelectric behavior persisted after exposing the device to the larger gate voltages.

FIG. 8 shows the measured and fitted CV characteristic of a typical varactor in paraelectric state, where the fitted parameters are $T_0$=726 K and equivalent oxide thickness (EOT)=4 nm. Here $T_0$ refers to effective (disorder) temperature, which is an empirical parameter that quantifies the potential disorder observed by the carriers in graphene and can be converted to the standard deviation in fluctuation potential, $\sigma$, using the multiplication factor $\sigma$=0.15 mV×$T_0$ (K).

FIG. 9 compares the CV characteristics of the same device before and after the domain activation with another curve measured after tuning the $V_{Dirac}$ to about 1V. Large shifts in the measured minimum capacitance ($C_{min}$) and reduction in the tuning ratio are observable, which can be explained using the observed correlation between the $C_{min}$ and $\sigma$ deviations, as shown in FIG. 10. Corresponding fitting results indicate clear correlation between the measured $C_{min}$ and $T_0$ (FIG. 10). In the absence of appreciable changes in the EOT, the changes in the $C_{min}$ and tuning ratio degradation are believed to be due to the increase in disorder arising from interdomain and also defect induced polarization variations across the hafnium zirconate volume.

Figure 13:
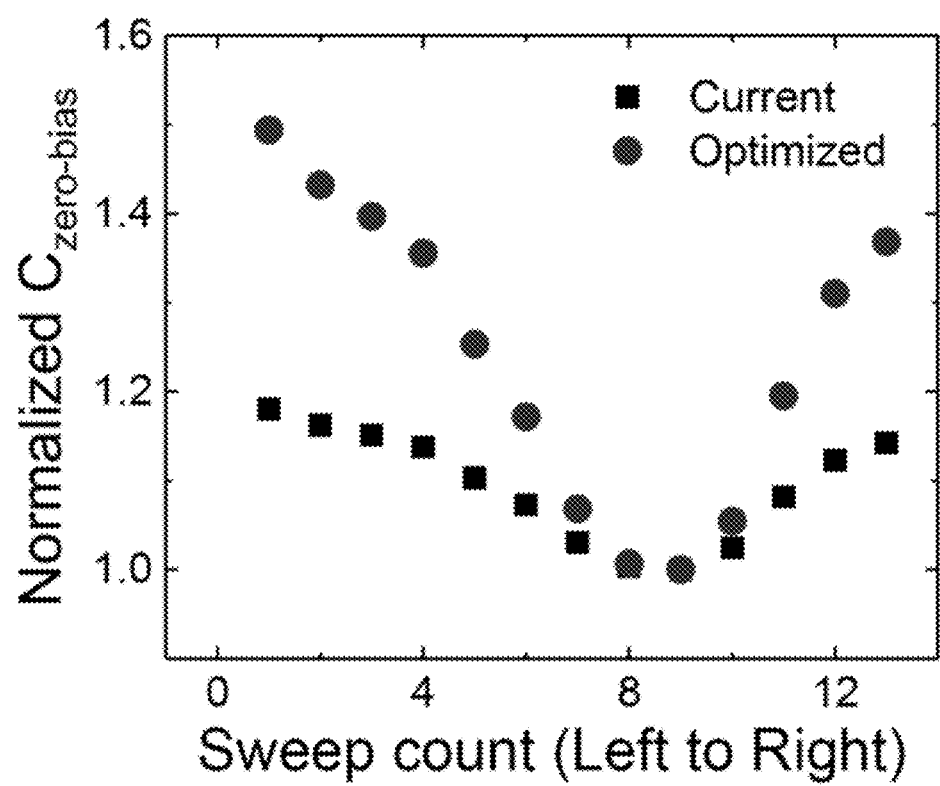
FIG. 13 is a plot of measured and predicted optimized non-volatile tuning at zero-bias obtained from the capacitance-voltage sweeps of FIG. 11.

FIG. 11 shows that the $V_{Dirac}$ can be fine-tuned over a large range (1.7V) of voltages without any significant loss in the tuning ratio. The corresponding variations in the $C_{min}$ and $T_0$ (FIG. 12) provide further insights into the various polarization states. Particularly, FIG. 11 reveals that the same net polarization state can be achieved with significantly different disorder. FIG. 13 shows the zero-bias or non-volatile tunability of the capacitance in the current varactor structure and an optimized structure with a reduced EOT. In the current varactor structure with EOT=4 nm, a non-volatile tuning ratio of 1.2 was achieved. As shown by the "optimized" data, the tuning ratio can be increased to 1.5 by reducing the EOT to 1 nm. Further improvement is also predicted to be possible through use of ferroelectrics with larger remnant polarizations such as $BaTiO_3$ which also have a higher dielectric constant. Apart from demonstrating novel functionality in the graphene varactors, these results show that with the help of further analysis and modeling, graphene can be used to understand the otherwise inaccessible fundamental nature of the ferroelectrics.

Various examples have been described. These and other examples are within the scope of the following claims.

The invention claimed is:

1. A varactor comprising:
    a gate electrode;
    a graphene layer; and
    a ferroelectric layer between the gate electrode and the graphene layer,
    wherein a capacitance tuning range of the varactor is based at least partially on a quantum capacitance effect of the graphene layer, and
    wherein a capacitance state of the varactor is non-volatile and based at least partially on the quantum capacitance effect.

2. The varactor of claim 1, further comprising a dielectric material between the ferroelectric layer and the graphene layer.

3. The varactor of claim 1, further comprising a dielectric material between the gate electrode and the ferroelectric layer.

4. The varactor of claim 1, further comprising an insulator layer, wherein the gate electrode is recessed in the insulator layer, and wherein the ferroelectric layer is over the gate electrode and the insulator layer.

5. The varactor of claim 4, further comprising a protective insulator on an exposed surface of the graphene layer opposite the ferroelectric layer.

6. The varactor of claim 1, further comprising an insulator layer, wherein the graphene layer is over the insulator layer, wherein the ferroelectric layer is over the graphene layer, and wherein the gate is over the ferroelectric layer.

7. The varactor of claim 1, wherein the ferroelectric layer comprises a hafnium-based ferroelectric.

8. The varactor of claim 1, wherein the ferroelectric layer comprises at least one of hafnium zirconate, hafnium lanthanate, or barium titanate.

9. The varactor of claim 1, wherein the graphene layer comprises a graphene monolayer.

10. The varactor of claim 1, further comprising at least two electrical contacts in electrical contact with the graphene layer.

11. The varactor of claim 1, wherein the varactor is part of an electrical device that includes an inductor electrically connected to the varactor, wherein the inductor and the varactor form an LC oscillator circuit having a resonant frequency responsive to a sense charge collected by the varactor.

12. A varactor comprising:
    an insulator layer defining a plurality of fingers, wherein a first finger of the plurality of fingers extends in a first direction within the insulator layer, and wherein a second finger of the plurality of fingers extends in a second direction substantially opposite to the first direction;
    a gate electrode in the plurality of fingers;
    a first graphene layer positioned over the first finger;
    a second graphene layer positioned over the second finger;
    a ferroelectric layer between the gate electrode and the first graphene layer and between the gate electrode and the second graphene layer; and
    at least one contact electrode formed on the first and second graphene layers and making electrical contact with the first and second graphene layers,
    wherein a capacitance tuning range of the varactor is based at least partially on a quantum capacitance effect of the graphene layer, and
    wherein a capacitance state of the varactor is non-volatile and based at least partially on the quantum capacitance effect.

13. The varactor of claim 12, further comprising a dielectric material between the ferroelectric layer and the graphene layer.

14. The varactor of claim 12, further comprising a dielectric material between the gate electrode and the ferroelectric layer.

15. The varactor of claim 12, further comprising a protective insulator on an exposed surface of the graphene layer opposite the ferroelectric layer.

16. The varactor of claim 12, wherein the ferroelectric layer comprises a hafnium-based ferroelectric.

17. The varactor of claim 12, wherein the ferroelectric layer comprises at least one of hafnium zirconate, hafnium lanthanate, or barium titanate.

18. The varactor of claim 12, wherein the graphene layer comprises a graphene monolayer.

19. The varactor of claim 12, wherein the varactor is part of an electrical device that includes an inductor electrically connected to the varactor, wherein the inductor and the varactor form an LC oscillator circuit having a resonant frequency responsive to a sense charge collected by the varactor.

20. A varactor comprising:
    a gate electrode;
    a graphene layer consisting essentially of graphene; and
    a ferroelectric layer between the gate electrode and the graphene layer,
    wherein a capacitance tuning range of the varactor is based at least partially on a quantum capacitance effect of the graphene layer, and
    wherein a capacitance state of the varactor is non-volatile and based at least partially on the quantum capacitance effect.

* * * * *